(12) United States Patent
Sayavong

(10) Patent No.: US 8,154,877 B2
(45) Date of Patent: Apr. 10, 2012

(54) EXPANSION SYSTEM FOR PORTABLE ELECTRONIC DEVICES

(75) Inventor: Rajmy Sayavong, Grimsby (CA)

(73) Assignee: Psion Teklogix Inc., Mississauga (CA)

( * ) Notice: Subject to any disclaimer, the term of this patent is extended or adjusted under 35 U.S.C. 154(b) by 552 days.

(21) Appl. No.: 12/256,020

(22) Filed: Oct. 22, 2008

(65) Prior Publication Data

US 2009/0154116 A1    Jun. 18, 2009

Related U.S. Application Data

(60) Provisional application No. 60/982,017, filed on Oct. 23, 2007.

(51) Int. Cl.
*H05K 5/00* (2006.01)

(52) U.S. Cl. ............ 361/752; 235/472.01; 710/303; 718/117; 345/169

(58) Field of Classification Search ........... 235/472.01, 235/439, 383, 462.2, 462.04; 379/93.05, 379/166, 229, 9.05; 361/679.02, 748, 752, 361/810, 679.41, 679.44, 679.27, 679.31, 361/679.47; 710/301, 302, 300, 7, 303; 439/328, 439/630, 65, 637; 711/103, 105, 114; 718/100, 718/102, 117, 107; 345/159, 165, 169
See application file for complete search history.

(56) References Cited

U.S. PATENT DOCUMENTS

| | | | |
|---|---|---|---|
| 6,215,656 | B1 | 4/2001 | O'Neal et al. |
| 6,681,001 | B1 * | 1/2004 | Clayton et al. ......... 379/93.05 |
| 6,751,552 | B1 | 6/2004 | Minelli |
| 2004/0248461 | A1 | 12/2004 | Marcinkiewicz et al. |
| 2006/0104021 | A1 | 5/2006 | Chen et al. |
| 2007/0247136 | A1 | 10/2007 | Wallmark et al. |
| 2009/0184942 | A1 * | 7/2009 | Wong et al. .............. 345/175 |
| 2009/0264148 | A1 * | 10/2009 | Tom ...................... 455/550.1 |
| 2010/0025473 | A1 * | 2/2010 | Boyd ................... 235/472.01 |
| 2011/0211309 | A1 * | 9/2011 | Gandhi ................. 361/679.26 |
| 2011/0261548 | A1 * | 10/2011 | Gandhi ...................... 361/810 |

FOREIGN PATENT DOCUMENTS

| | | |
|---|---|---|
| CN | 2611960 Y | 4/2004 |
| CN | 1799295 A | 7/2006 |
| WO | 2005/060218 A1 | 6/2005 |

* cited by examiner

*Primary Examiner* — Hung Duong
(74) *Attorney, Agent, or Firm* — Pearne & Gordon LLP

(57) ABSTRACT

An expansion system for portable electronic devices is provided. A portable electronic device includes: a main logic board; an expansion device for expanding functionality of the portable electronic device; a flexible interconnection for logically connecting the expansion device to the main logic board; and a package for enclosing the main logic board and the expansion device together. The main logic board is mechanically isolated from the expansion device. The expansion device is physically spaced from the main logic board when enclosed in the package. An intrinsic expansion for a portable electronic device includes: an expansion board for expanding functionality of the portable electronic device, an expansion interface for logically connecting the expansion board to a main logic board of the portable electronic device, and a flexible interconnection for interconnecting the expansion board and the expansion interface. The expansion device is mounted in the portable electric device so as to be physically spaced from the main logic board when assembled.

15 Claims, 4 Drawing Sheets

EXPANSION SYSTEM FOR PORTABLE ELECTRONIC DEVICES

FIELD OF INVENTION

This invention relates to portable electronic devices, and more specifically to a system for expanding functionality of the portable electronic devices.

BACKGROUND OF THE INVENTION

Portable electronic devices, such as personal digital assistants (PDAs), have become more popular due to their compact sizes and mobility. However, the portable devices suffers from their limited functionality.

A typical conventional PDA includes an externally accessible connector to connect the PDA to another component, such as a computer, in order to expand the functionality of the PDA. However, to employ the externally accessible connector, it generally requires the enclosure of the PDA to be compromised, either a door opens or removal of a portion of the enclosure. This would cause the ingress of undesirable materials, such as water and dust.

SUMMARY OF THE INVENTION

It is an object of the invention to provide an improved a portable electronic device expansion system that obviates or mitigates at least one of the disadvantages of existing systems.

According to an aspect of the present invention there is provided a portable electronic device, which includes: a main logic board; an expansion device for expanding functionality of the portable electronic device; a flexible interconnection for logically connecting the expansion device to the main logic board; and a package for enclosing the main logic board and the expansion device together. The main logic board is mechanically isolated from the expansion device. The expansion device is physically spaced from the main logic board when enclosed in the package According to another aspect of the present invention there is provided an intrinsic expansion for a portable electronic device, which includes: an expansion board for expanding functionality of the portable electronic device, an expansion interface for logically connecting the expansion board to a main logic board of the portable electronic device, and a flexible interconnection for interconnecting the expansion board and the expansion interface. The expansion device is mounted in the portable electric device so as to be physically spaced from the main logic board when assembled.

BRIEF DESCRIPTION OF THE DRAWINGS

These and other features of the invention will become more apparent from the following description in which reference is made to the appended drawings wherein.

DETAILED DESCRIPTION

Embodiments of the present invention are described using a PDA. However, it would be appreciated by one of ordinary skill in the art that any portable devices, such as portable imagers, scanners, barcode readers, cell-phones, fall within the scope of the embodiments. As described below, the PDA according to the embodiments of the present invention includes an intrinsic expansion that allows for future expansion of the PDA capability without redesign of electronics mounted in the PDA and provides electrical interfaces such that they are protected from the environment in a robust mechanical manner.

For clarity and without loss of generality, the front (side) of the PDA is one side of the PDA, which faces the user when using that PDA and may have a user interface, such as display, keyboards. The back (side) of the PDA is the side opposite to the front side.

In the embodiments, relative terms, such as "back" and "front", are used to describe the geographical sides on the portable electronic device. However, it will be appreciated by one of ordinary skill in the art that the terms "back" and "front" are examples only, and may encompass two different sides which may be changed, for example, according to the design requirement. In the embodiments, the terms "housing", "cover", "packaging" and "enclosure" may be used interchangeably.

Referring to FIGS. 1-4, there is illustrated an example of a portable electronic device with an intrinsic expansion in accordance with an embodiment of the present invention. The portable electronic device 10 of FIGS. 1-4 is a PDA. In FIGS. 1-4, components/elements/layers illustrated are schematic in nature and their shapes are not intended to illustrate their precise shapes.

The PDA 10 includes an intrinsic mechanical, electrical and software ready interface for expanding the technical capabilities of the PDA 10, without modifying a printed circuit assembly mounted on the device 10. A party desiring to implement an expanding technology does not require to modify the printed circuit assembly as manufactured. Whereas the expansion interface is internal to the PDA 10, the mechanical enclosure of the PDA 10 protects it from the environment, an external door/section is not required to be removed. The expansion interface is located in a manner that allows the expansion technology to interface to it remain flexible, and thus will not cause impact to the expansion interface.

The intrinsic expansion of the PDA 10 supports specific signal protocols such as Universal Serial Bus (USB), Serial and Compact Flash (CF), as described below. For example, USB or Serial may be used for RFID; USB may be used for the printer; and USB/Serial may be used for Biometrics. Direct host battery power is provided to the intrinsic expansion.

Figure 1:
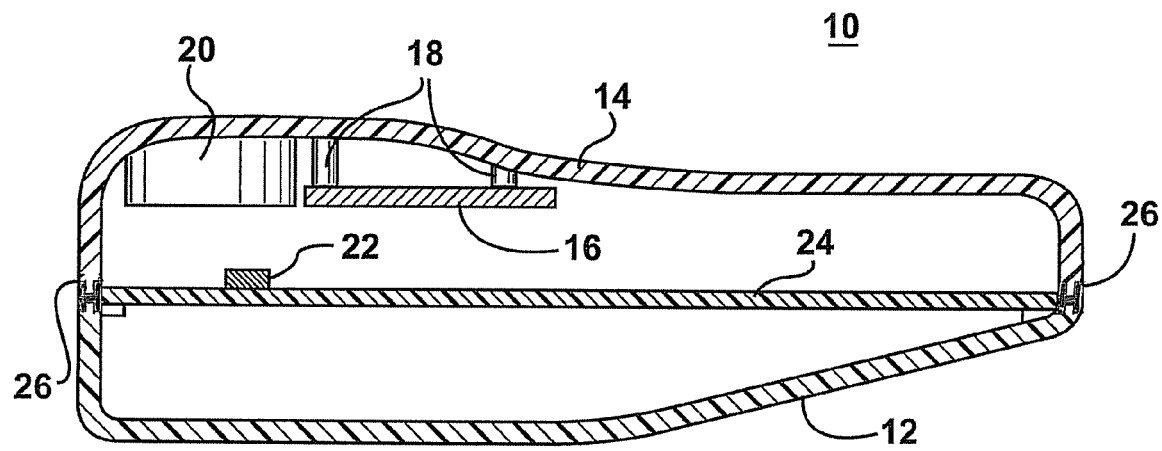
FIG. 1 is a cross section view of an example of a portable electronic device with an intrinsic expansion in accordance with an embodiment of the present invention.
Figure 2:
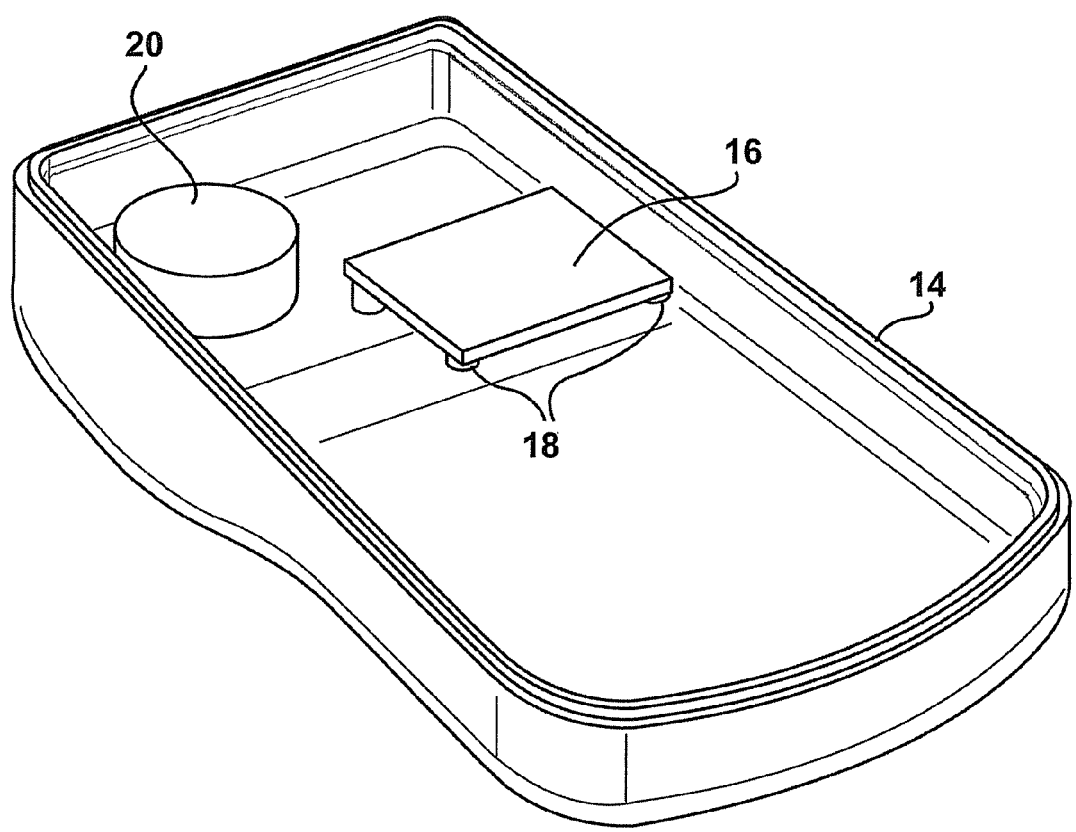
FIG. 2 is a perspective view of a back cover and electronics mounted on the back cover of the portable electronic device of FIG. 1.
Figure 3:
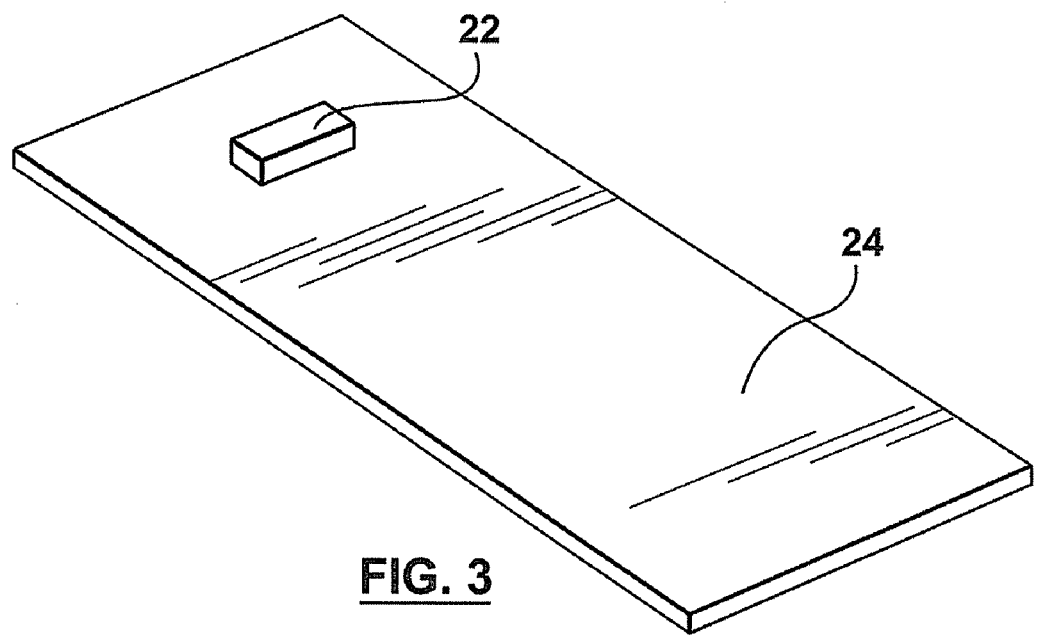
FIG. 3 is a perspective view of a main logic board and an expansion connector on the main logic board in the portable electronic device of FIG. 1.
Figure 4:
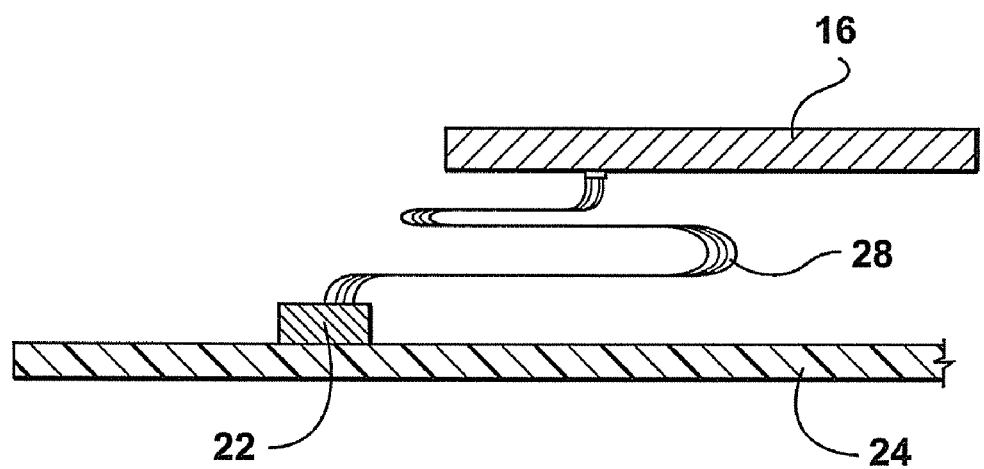
FIG. 4 is a side view of the main logic board and an expansion connected to the main logic board via a connection.
Figure 5:
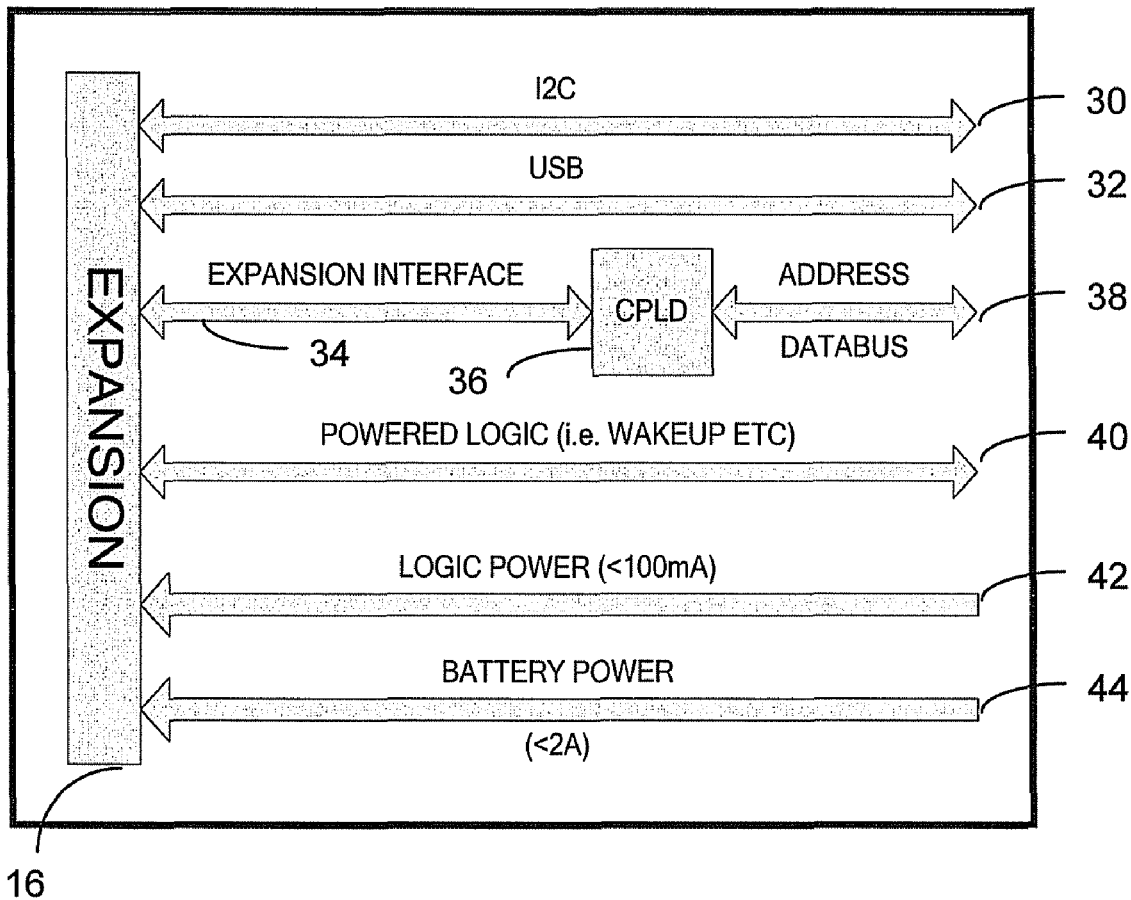
FIG. 5 is a schematic diagram illustrating expansion signals for the intrinsic expansion of FIGS. 1-4.

The PDA 10 includes a packaging having a front cover 12 and a back cover 14 and electronics (e.g., 16, 20, 24 of FIG. 1). The front cover 12 and the back cover 14 are, for example, custom plastic covers, and are molded so as to meet design requirements (e.g., sealing, size, weight etc) and enclose the electronics.

The electronics enclosed in the PDA 10 include a main logic board 24 (printed circuit board) for operating the PDA 10, and an expansion board 16 for expanding the functionality of the PDA 10. The electronics enclosed in the PDA 10 may further include, for example, but not limited to, a speaker 20. The speaker 20 is mounted on the inside of the back cover 14, and is directly connected to the main logic board 24. A USB hub may be in the PDA 10.

One of ordinary skill in the art would appreciate that the portable electronic device 10 of FIGS. 1-4 may include electronics/optics/components/elements not illustrated in the drawings, such as, cell phone functionality, a microphone, a scanner, a volume controller, a visual indicator, and a battery component.

Figure 6:
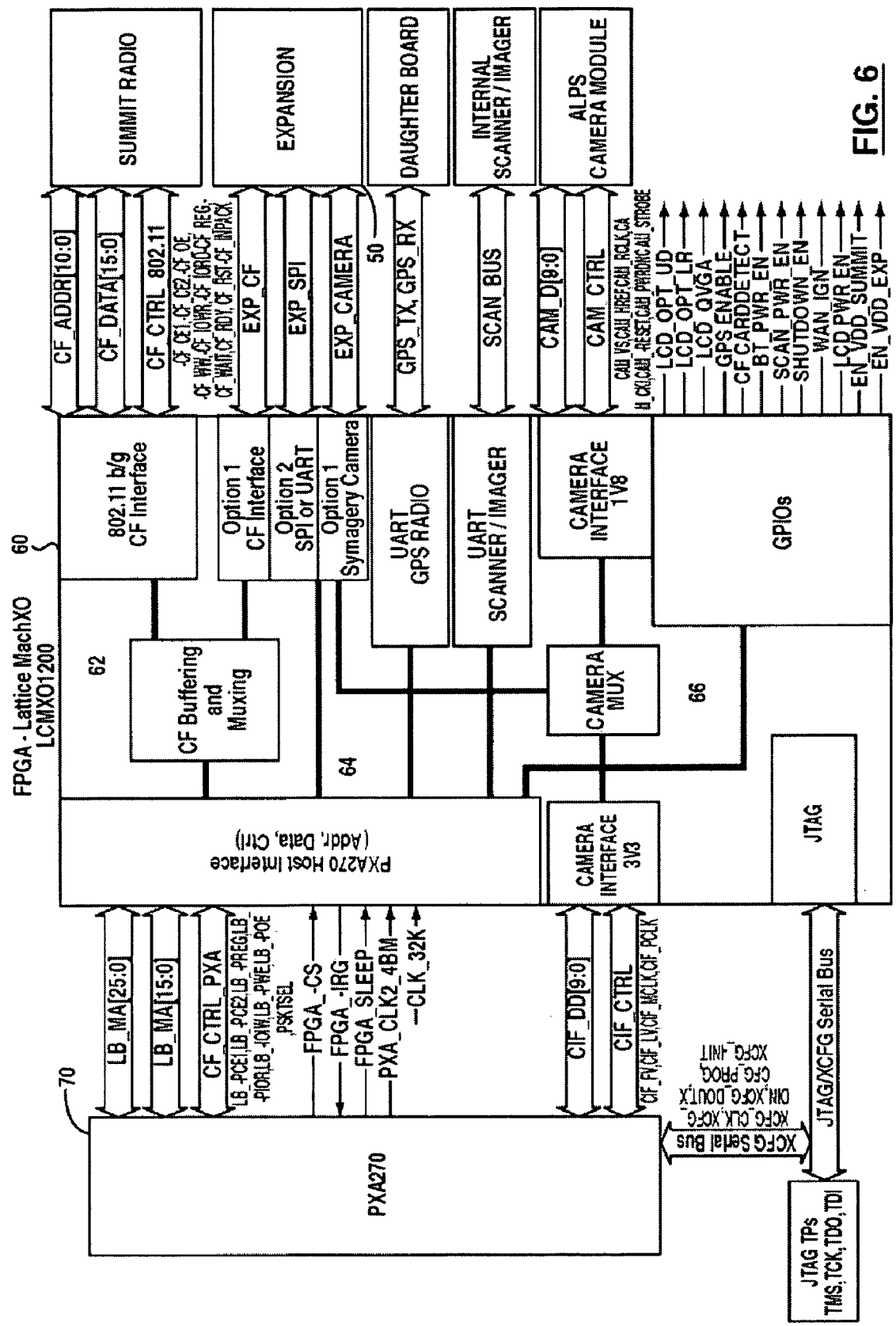
FIG. 6 is a block diagram illustrating an example of the main logic board and the intrinsic expansion of FIGS. 1-4.

The main logic board 24 contains a plurality of primary components, as it would be understood by one of ordinary skill in the art. For example, the main logic board 24 includes a processor, a main memory, and support circuitry. Field Programmable Gate Array (FPGA) is located on the main logic board 24 (e.g., 60 of FIG. 6). The main logic board 24 can be electrically coupled to the components of the PDA 10. The main logic board 24 may also be electrically connected to a battery component (not shown) for powering the main logic board 24 and the components of the PDA 10.

The expansion board 16 is mounted on the inside of the back cover 14 through a mounting interface 18. The mounting interface 18 positions the expansion board 16 in the PDA 10. When assembled, the expansion board 16 is internally mounted in the PDA 10 so that it is physically spaced from the main logic board 24. The expansion board 16 is not mounted on the main logic board 24. The expansion board 16 is mechanically disconnected from the main logic board 24.

In this example, the mounting interface 18 is on the back cover 14, and provides a support for mounting the expansion board 16 on the back cover 14. The mounting interface 18 may be, for example, but not limited to, a frame or a mounting boss. The boss may be molded with the back cover 14. The frame may be formed on the back cover 14. In this example, the back cover 14 is molded so as to provide the mounting interface 18 and space the expansion board 16 from the main logic board 24. The expansion board 16 may be sealed from the main logic board 24 by pressing a sealing sheet around the expansion board 16 or the frame. The sealing sheet may have an opening through which a connection (e.g., 28) passing between the expansion board 16 and the main logic board 24.

The functionality of the PDA 10 is expanded through the expansion board 16, as designed. The expanded functionality may include, for example, but not limited to, RFID, scanner, printer, biometrics, WAN radio. The mounting interface 18 located on the back cover 14 minimizes impact on existing mechanical restraints.

The expansion board 16 is logically connected to the main logic board 24 through an expansion connector 22 mounted on the main logic board 24. The expansion board 16 is interconnected to the expansion connector 22 through a flexible interconnection 28, such as a flex circuit or equivalent. The flexible interconnection 28 is releasably connected to the expansion connector 22, the expansion board 16, or a combination thereof. The expansion connector 22 may have, for example, but not limited to, a latch for releasably latching the flexible interconnection 28. The expansion board 16 may have, for example, but not limited to, a latch for releasably latching the flexible interconnection 28. The expansion board 16 interfaces with the expansion connector 22 to receive/transmit relevant information/data according to, for example, USB, Serial or CF formats. Power is also supplied to the expansion board 16, through the main logic board 24, using the interconnection 28.

The interconnection 28 may be a custom flex cable, and is long enough to interconnect it to the expansion connector 22 without damaging the main logic board 24. The expansion connector 22, the expansion board 16 and the interconnection 28 allow for each component to be reinstalled or replaced in the field without giving mechanical impact on each other.

The expansion connector 22 is, for example, but not limited to, a 60 pin connector with standard protocol signals and power. In this example, the expansion connector 22 is an industry standard connector. The expansion connector 22 may be electrically connected to a battery component (not shown), and provides system battery power directly to the expansion board 16.

The expansion connector 22 is packaged in a robust manner. For example, the expansion connector 22 is directly soldered to the main logic board 24 and allows for the communications signals according to, for example, but not limited to, USB, Serial, CF, RS232 formats. The processor of the main logic board 24 logically recognizes the expansion board 16, through the expansion connector 22. The standard protocols supports plug and play capability of the interconnection 28 into the expansion connector 22.

The PDA 10 may have a seal 26. The seal 26 is a mechanical enclosure that ensures environmental seal of the PDA 10. The seal 26 is, for example, a rubber gasket. The seal 26 may be a H-connector. The seal 26 goes around the circumference of the front cover 12 and the back cover 14. The seal 26 joints the front cover 12 and the back cover 14. The seal 26 is designed so that the PDA 10 has optimal pressures around the seal 26. The seal 26 is designed so that force is distributed all around the seal 26. The seal may be designed so as to meet IEC Ingress Penetration (IP) rating of IP 65.

With reference to FIGS. 1-5, expansion signals are described in detail. In one example, the expansion board 16 is connected to the expansion connector 22 through a I2C bus 30, a USB (Universal Serial Bus) 32, an expansion interface bus 34, a powered logic line 40, a logic power line 42, and a battery power line 44. The I2C 30 and USB 32 perform the data transmission. An address and data bus 38 is provided for communications. The powered logic line 40 provides, for example, a wakeup command to the expansion board 16. The lines 42 and 44 provide power to the expansion board 16 where the amount of current is, for example, <100 mA (42) and <2 A (44).

A complex programmable logic device (CPLD) 36 may be employed to provide additional control and signal enabling/disabling, similar to the FPGA, which assists in achieving the functional control for the expansion device.

The main logic board 24 is mechanically isolated from the expansion board 16. Thus, it is not required to modify the main logic board 24 to expand the functionality of the PDA 10. The expansion board 16 will be chosen, changed or implanted within the requirements for the expansion connector 22.

The expansion board 16 is insulated from the electrical interface of the expansion connector 22. Thus the connector 22 can be chosen, which suits the expansion board 16.

In addition, heat generated from the main logic board 24 and the expansion board 16 would not affect each other since there are not mechanically interconnected to each other, so that heat dissipation issue would be minimized.

Hardware Development Kit (HDK) may be provided to define electrical interfaces, pinouts, signal quality and characteristics, states of operation, power requirements (power quality and characteristics). HDK may be the interface to the main logic board 24 and mechanical details for the packaging (e.g., back cover 14, front cover 12, seal 26) and any required hardware to assemble the PDA as a whole.

There is a software isolation between communications with the expansion board 16 and communications with the expansion connector 22. Through the FPGA firmware, software can be isolated and control the communications between the expansion device and the main logic board 24 to enable or disable its functionality.

The intrinsic expansion interface of the PDA 10 gives the opportunity to the host designer, or external groups to develop to their requirements an enclosure of the device, which mounts the expanding technology, and have the electrical connections and interface ready and available. Having such availability ensures that the enclosure is not compromised from the environmental.

Referring to FIGS. 1-4 and 6, one example of the expansion interface (e.g., connector 22) and FPGA on the main logic board 24 is explained. The expansion interface 50 includes 1) interface to the FPGA 60 on the main logic board 24, 2) interface to USB hub, and 3) interface to direct battery power.

The FPGA 60 serves to control the communications/signaling/control between the expansion device and the core of the PDA technologies. The FPGA 60 provides a plurality of services, including: buffering and multiplexing Compact Flash (CF) signals (e.g., 62 of FIG. 6) to the main CPU of the PDA 10 (e.g., 70 of FIG. 6); direct address allocation of Serial Peripheral Interface (SPI) (e.g., 64 of FIG. 6) for synchronous serial data link to the CPU of the PDA 10; multiplexing camera interface (e.g., 66 of FIG. 6) for multi-imaging devices (camera and other add on imaging engines); identification ID to allow enable/disabling of signals and power; and I2C connectivity.

The expansion interface 50 furthermore directly extends the expansion device (16) to a USB hub in the PDA 10. In addition, the expansion interface 50 provides direct system power to the expansion device (16).

One or more currently preferred embodiments have been described by way of example. It will be apparent to persons skilled in the art that a number of variations and modifications can be made without departing from the scope of the invention as defined in the claims.

What is claimed is:

1. A portable electronic device, comprising:
    a package including a first cover and a second cover, for enclosing components of the portable electronic device in the inside of the package, the components of the portable electronic device including a main logic board and an expansion device expanding functionality of the portable electronic device, the package being sealed to prevent ingress of material from the surrounding environment into the inside of the package;
    a mounting interface extending from the first cover toward the inside of the package, for mounting the expansion device in the inside of the sealed package such that the expansion device is physically spaced from the main logic board and mechanically disconnected from the main logic board; and
    an expansion interface mounted on the main logic board, for logical communications between the expansion device and the main logic board.

2. A portable electronic device as defined in claim 1, further comprising:
    a flexible interconnection between the expansion device and the expansion interface for logically connecting the expansion device to the main logic board.

3. A portable electronic device as defined in claim 1, wherein the expansion interface comprises:
    a connector implementing standard communications protocol.

4. A portable electronic device as claimed in claim 3, wherein system power from the connector is directly provided to the expansion device.

5. A portable electronic device as defined in claim 1, wherein the package is sealed by
    a rubber gasket.

6. A portable electronic device as claimed in claim 1, wherein a Field Programmable Gate Array (FPGA) is mounted on the main logic board.

7. A portable electronic device as claimed in claim 1, wherein the FPGA provides at least one of:
    buffering and multiplexing Compact Flash (CF) signals to a main CPU of the portable electronic device;
    direct address allocation of Serial Peripheral Interface (SPI) for synchronous serial data link to the CPU of the portable electronic device;
    multiplexing interface for multi-imaging devices;
    identification ID, to allow enable/disabling of signals and power; and
    I2C connectivity.

8. A portable electronic device as claimed in claim 1, wherein the expansion interface includes at least one of:
    interface to a FPGA on the main logic board;
    interface to a USB hub in the portable electronic device; and
    interface to direct battery power.

9. A portable electronic device, comprising:
    a package including a first cover and a second cover, for enclosing components of the portable electronic device in the inside of the package, the components of the portable electronic device including a main logic board and an expansion device, the package being sealed to prevent ingress of material from the surrounding environment into the inside of the package;
    a flexible interconnection for logically interconnecting the expansion device to the main logic board to expand functionality of the portable electronic device; and
    a mounting interface extending from the first cover toward the inside of the package, for mounting the expansion device in the inside of the sealed package such that the expansion device is physically spaced from the main logic board and mechanically disconnected from the main logic board.

10. A portable electronic device as defined in claim 9, wherein:
    the package is sealed by a rubber gasket.

11. A portable electronic device as defined in claim 9, comprising:
    an expansion interface mounted on the main logic board, for logical communications between the expansion device and the main logic board.

12. A portable electronic device as defined in claim 11, wherein the expansion interface comprises:
    a connector with standard communications protocol.

13. A portable electronic device as claimed in claim 12, wherein system power from the connector is directly provided to the expansion device.

14. A portable electronic device as claimed in claim 11, wherein the expansion interface includes at least one of:
    interface to a FPGA on the main logic board;

interface to a USB hub in the portable electronic device; and interface to direct battery power.

15. A portable electronic device as claimed in claim 14, wherein the FPGA provides at least one of:

buffering and multiplexing Compact Flash (CF) signals to a main CPU of the portable electronic device;

direct address allocation of Serial Peripheral Interface (SPI) for synchronous serial data link to the CPU of the portable electronic device;

multiplexing interface for multi-imaging devices;

identification ID to allow enable/disabling of signals and power; and

I2C connectivity.

* * * * *

UNITED STATES PATENT AND TRADEMARK OFFICE
CERTIFICATE OF CORRECTION

PATENT NO. : 8,154,877 B2
APPLICATION NO. : 12/256020
DATED : April 10, 2012
INVENTOR(S) : Rajmy Sayavong Page 1 of 1

It is certified that error appears in the above-identified patent and that said Letters Patent is hereby corrected as shown below:

In column 6, line 17, being line 1 in Claim 7, please delete "claim 1" and insert therefor --claim 6--.

Signed and Sealed this
Twelfth Day of June, 2012

David J. Kappos
*Director of the United States Patent and Trademark Office*